United States Patent
Shibata et al.

(10) Patent No.: US 6,869,702 B2
(45) Date of Patent: Mar. 22, 2005

(54) SUBSTRATE FOR EPITAXIAL GROWTH

(75) Inventors: Tomohiko Shibata, Aichi (JP); Shigeaki Sumiya, Aichi (JP); Keiichiro Asai, Aichi (JP); Mitsuhiro Tanaka, Aichi (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/738,187

(22) Filed: Dec. 17, 2003

(65) Prior Publication Data

US 2004/0131866 A1 Jul. 8, 2004

(30) Foreign Application Priority Data

Dec. 18, 2002 (JP) .................................... P2002-366679

(51) Int. Cl.[7] .................................................. B32B 9/04
(52) U.S. Cl. ....................... 428/698; 428/620; 428/336
(58) Field of Search ................................ 428/698, 336, 428/620

(56) References Cited

U.S. PATENT DOCUMENTS

| | | | | |
|---|---|---|---|---|
| 5,915,194 A | * | 6/1999 | Powell et al. ............... | 438/478 |
| 6,117,735 A | * | 9/2000 | Ueno ......................... | 438/268 |
| 6,252,255 B1 | * | 6/2001 | Ueta et al. ................. | 257/94 |
| 6,426,519 B1 | * | 7/2002 | Asai et al. ................. | 257/103 |
| 6,488,771 B1 | * | 12/2002 | Powell et al. ............. | 117/89 |
| 6,531,719 B2 | * | 3/2003 | Shibata et al. ............ | 257/190 |
| 6,583,468 B2 | * | 6/2003 | Hori et al. ................. | 257/327 |
| 6,649,493 B2 | * | 11/2003 | Asai et al. ................. | 438/481 |
| 6,706,620 B2 | * | 3/2004 | Shibata et al. ............ | 438/604 |

OTHER PUBLICATIONS

Toshio Nishida et al., "Step–Flow Metalorganic Vapor Phase Epitaxy of GaN on SiC Substrates," Japan Journal of Applied Physics, vol. 37 (1998), Part 2, No. 4B, Apr. 15, 1998, pp. L459–L461.

* cited by examiner

Primary Examiner—Stephen Stein
(74) Attorney, Agent, or Firm—Burr & Brown

(57) ABSTRACT

A substrate for epitaxial growth allowing formation of an Al-containing group III nitride film having high crystal quality is provided. A nitride film containing at least Al is formed on a 6H—SiC base by CVD at a temperature of at least 1100° C., for example. The substrate for epitaxial growth allowing formation of an Al-containing group III nitride film having high crystal quality is obtained by setting the dislocation density of the nitride film to not more than $1 \times 10^{11}/cm^2$, the full width at half maximum of an X-ray rocking curve for (002) plane to not more than 200 seconds and the full width at the half maximum of the X-ray rocking curve for (102) plane to not more than 1500 seconds.

10 Claims, 3 Drawing Sheets

SUBSTRATE FOR EPITAXIAL GROWTH

This application claims the benefit of Japanese Application P2002-366679, filed Dec. 18, 2002, the entirety of which is incorporated herein by reference.

BACKGROUND OF THE INVENTION

1. Field of the Invention

The present invention relates to a substrate for epitaxial growth employed as the substrate for various types of semiconductor devices.

2. Description of the Background Art

An Al-containing group III nitride film is employed as a semiconductor film constituting a semiconductor light-emitting device or a semiconductor photoreceptor or an underlayer for growing this semiconductor film. In recent years, the Al-including group III nitride film has also been remarked as a semiconductor film constituting an electronic device such as a high-speed IC chip employed for a portable telephone or the like or a shortwave LED.

The aforementioned semiconductor device is obtained by forming a buffer layer consisting of a group III nitride on a single-crystalline base consisting of a single crystal of sapphire or the like if necessary, thereafter forming an underlayer consisting of an Al-containing group III nitride film on the buffer layer and forming a group III nitride film having various target functions on the underlayer. The single-crystalline base, the buffer layer and the underlayer are generally regarded as an integrated substance, which is referred to as a substrate for epitaxial growth.

The buffer film, exhibiting a buffering effect of complementing the difference between the lattice constants of the base and the underlayer, is formed at a low temperature of 500 to 700° C. in a temperature range insufficient for ensuring crystallinity.

Another substrate for epitaxial growth may be obtained by forming a buffer film and an underlayer both consisting of AlN on an SiC base having excellent heat dissipation capacity and a lattice constant closer to that of a group III nitride film than a single crystal of sapphire. In this case, the buffer film and the underlayer are formed by MOCVD at a high temperature of at least 1000° C.

When a sapphire base is employed for preparing a substrate for epitaxial growth, the buffer film formed at a low temperature as described above exhibits low crystallinity. If an underlayer is formed on this buffer film for forming an Al-containing group III nitride film provided with various functions thereon, therefore, these films cannot be sufficiently improved in crystallinity. The buffer film has a relatively large quantity of dislocations, to result in a large quantity of dislocations also in the underlayer and the Al-containing group III nitride film formed thereon. Further, the buffer film and the Al-containing group III nitride film exhibit high mosaicity, which is evaluated on the basis of an X-ray rocking curve. In addition, the group III nitride film, particularly an Al-containing one, is disadvantageously remarkably dispersed in crystal quality such as crystallinity and dislocation density due to the temperature history from formation of the buffer film up to formation of the Al-containing group III nitride film.

In other words, the Al-containing group III nitride film provided with various functions cannot attain sufficiently high crystal quality in view of crystallinity and dislocation density when the sapphire base is employed for preparing the substrate for epitaxial growth. Thus, a semiconductor light-emitting device including this Al-containing group III nitride film is deteriorated in luminous efficiency, for example.

When an SiC base is employed for preparing a substrate for epitaxial growth, a buffer film or an underlayer of AlN having a thickness of about 0.1 $\mu$m or less is formed at a high temperature, while the film is insufficient in crystallinity with this degree of thickness. This film is also insufficient in surface flatness due to pitting or the like. Further, the film is disadvantageously readily influenced by defects present on the surface of the SiC base.

SUMMARY OF THE INVENTION

The present invention relates to a substrate for epitaxial growth employed as the substrate for a semiconductor device.

The substrate for epitaxial growth according to the present invention comprises a 6H—SiC base and a nitride film formed on the 6H—SiC base, while the nitride film contains at least an Al element, and exhibits dislocation density of not more than $1 \times 10^{11}/cm^2$, full width at half maximum (FWHM) value of an X-ray rocking curve of not more than 200 seconds for (002) plane and FWHM value of the X-ray rocking curve of not more than 1500 seconds for (102) plane.

The crystal quality of one or more group III nitride films, particularly the Al-containing group III nitride films, is remarkably improved, when the one or more group III nitride films are formed on this substrate for epitaxial growth,. The characteristics of a finally obtained semiconductor device or the like are also remarkably improved.

Preferably, the thickness of the nitride film in the substrate for epitaxial growth is at least 0.2 $\mu$m.

The dislocation density and crystallinity of the nitride film are further improved while no cracking is caused in the nitride film. Further, the crystal quality of one or more group III nitride films, particularly the Al-containing group III nitride films, formed on the substrate for epitaxial growth is also further improved.

According to another aspect of the present invention, the 6H—SiC base has a nitrided layer, and the nitride film is formed on this nitrided layer.

Thus, the crystal quality of the nitride film is further improved, whereby the crystal quality of one or more group III nitride films, particularly the Al-containing group III nitride films, formed on the substrate for epitaxial growth is also further improved.

Accordingly, an object of the present invention is to provide a substrate for epitaxial growth allowing formation thereover of an Al-containing group III nitride film having excellent crystal quality.

The foregoing and other objects, features, aspects and advantages of the present invention will become more apparent from the following detailed description of the present invention when taken in conjunction with the accompanying drawings.

DETAILED DESCRIPTION OF THE INVENTION

Figure 1:
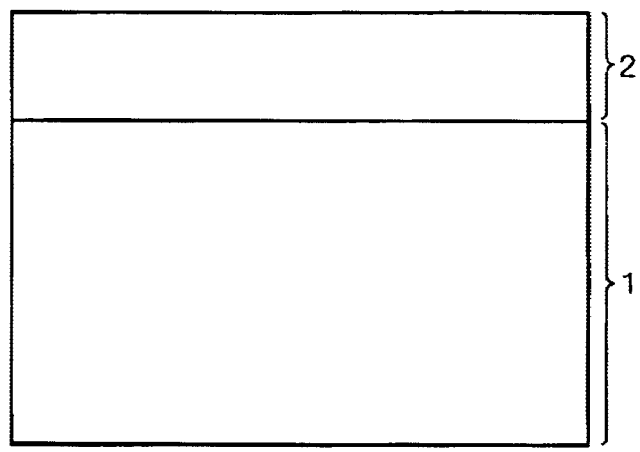
FIG. 1 is a schematic diagram showing an exemplary substrate for epitaxial growth according to the present invention.

FIG. 1 is a schematic sectional view showing the structure of a substrate 10 for epitaxial growth according to the present invention. The substrate 10 for epitaxial growth shown in FIG. 1 is constituted of a 6H—SiC base 1 and a group III nitride film 2 containing at least Al formed on the 6H—SiC base 1.

The group III nitride film 2, which can be expressed in a composition formula $Al_xGa_yIn_zN(0 \leq x,y,z \leq 1, x+y+z=1)$, must contain Al(x>0), while it is preferable that the Al content in the group III nitride film 2 is at least 50 atomic % ($x \geq 0.5$) with respect to all group III elements contained in the group m nitride film 2, and it is more preferable that all group III elements contained in the group III nitride film 2 are constituted of Al(x=1), i.e., the group III nitride film 2 is constituted of AlN.

In the substrate 10 for epitaxial growth shown in FIG. 1, the group III nitride film 2 containing a relatively large quantity of Al as described above is formed on the 6H—SiC base 1. The group III nitride film 2 is made to have a dislocation density of not more than $1 \times 10^{11}/cm^2$, preferably not more than $5 \times 10^{11}/cm^2$, and more preferably not more than $1 \times 10^{10}/cm^2$ by satisfying a prescribed preparation condition.

The group III nitride film 2 is further made to have such crystallinity that the full width at half maximum (FWHM) of an X-ray rocking curve for (002) plane is not more than 200 seconds and preferably not more than 150 seconds and the full width at the half maximum of the X-ray rocking curve for (102) plane is not more than 1500 seconds, preferably not more than 1200 seconds and more preferably not more than 1000 seconds by satisfying another prescribed preparation condition.

The group III nitride film 2 is further made to have a surface roughness Ra of not more than 3 Å in a region of 5 $\mu m^2$ measured with an AFM (atomic force microscope) by properly setting still another preparation condition. In this case, an atomic step constituted of several atomic layers can be observed on the surface with the AFM.

Similarly, the thickness of the group III nitride film 2 is set to at least 0.2 $\mu m$, preferably at least 0.3 $\mu m$ and more preferably at least 0.4 $\mu m$ by properly setting a further preparation condition. While a group III nitride film formed on an SiC base with a thickness of at least 0.2 $\mu m$ is generally cracked, the group III nitride film 2 of the substrate 10 for epitaxial growth according to the present invention is inhibited from cracking also when the thickness thereof is in excess of 0.2 $\mu m$. The thickness of the group III nitride film 2 is preferably not more than 1.2 $\mu m$. If the thickness exceeds 1.2 $\mu m$, the group III nitride film 2 may be cracked depending on the preparation condition.

Figure 3:
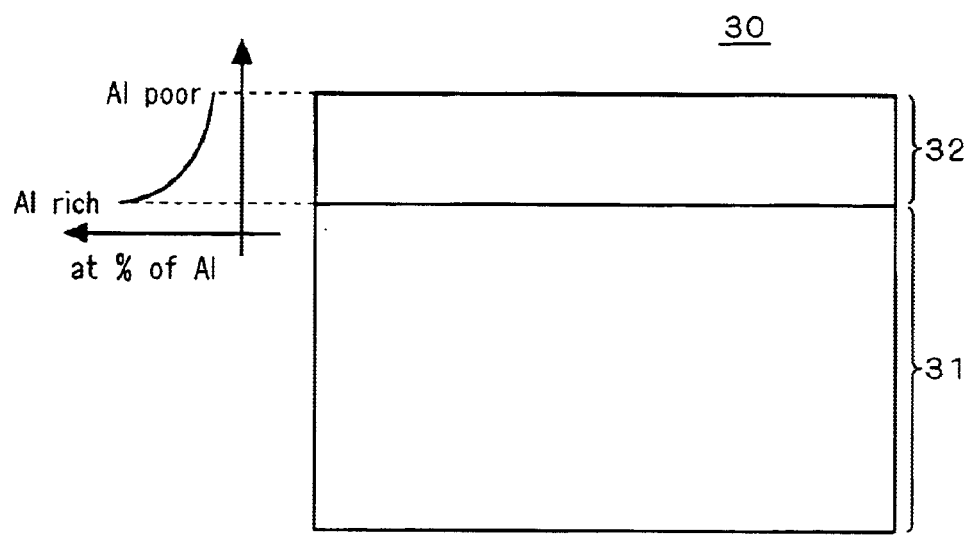
FIG. 3 is a schematic diagram showing an exemplary substrate for epitaxial growth having a group III nitride film exhibiting a continuously changing Al content.
Figure 4:
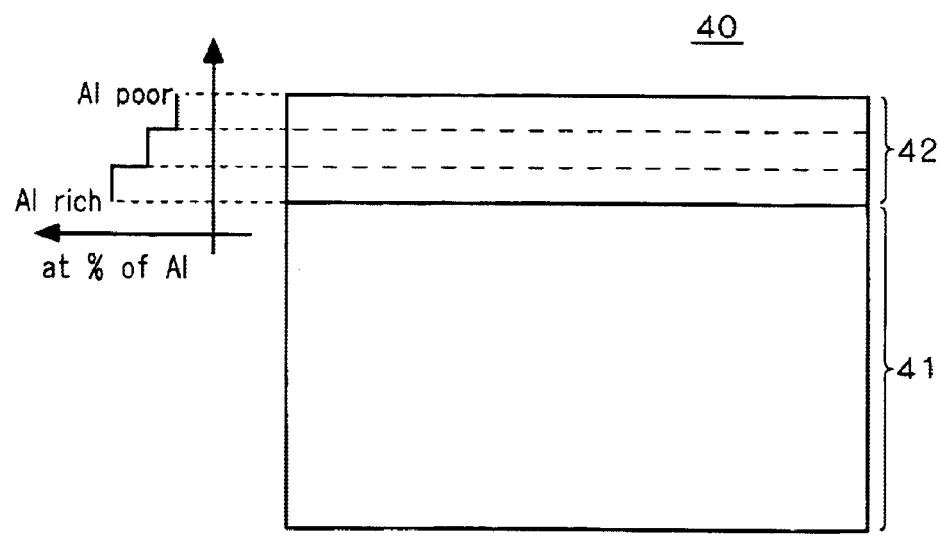
FIG. 4 is a schematic diagram showing an exemplary substrate for epitaxial growth having a group III nitride film exhibiting a stepwisely changing Al content.

Such cracking can be suppressed by forming a group III nitride film 32 so that the Al content continuously decreases from the side of a 6H—SiC base 31 toward the surface of an opposite film as in a substrate 30 for epitaxial growth shown in FIG. 3 or by forming a group III nitride film 42 so that the Al content stepwisely decreases from the side of a 6H—SiC base 41 toward the surface of an opposite film as in a substrate 40 for epitaxial growth shown in FIG. 4. Thus, a critical thickness of the group III nitride film 2 causing cracking is further reduced so that the thickness of the group III nitride film 2 can be se to at least 1.2 $\mu m$.

Figure 5:
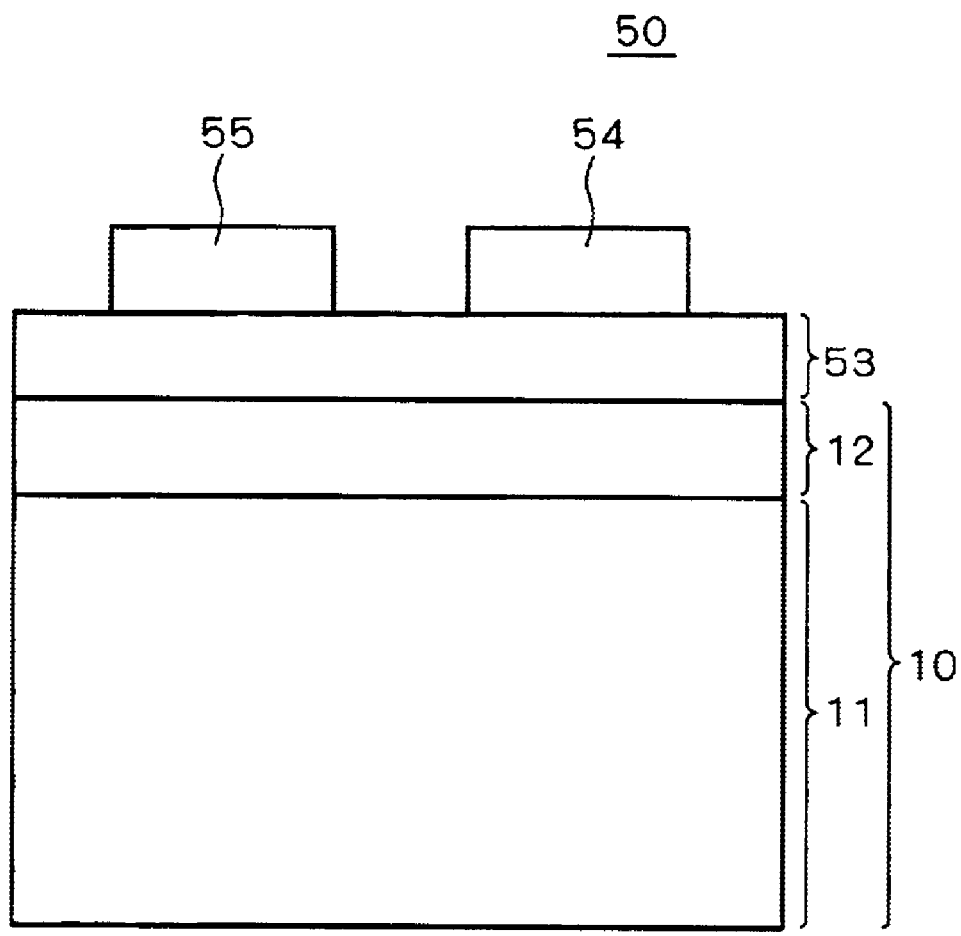
FIG. 5 is a schematic diagram showing an exemplary semiconductor light-emitting device employing a substrate for epitaxial growth according to the present invention.

Thus, the inventive substrate 10 for epitaxial growth shown in FIG. 1 has the group III nitride film 2 having excellent crystal quality on its surface. When another prescribed group III nitride film is formed on this group III nitride film 2, the crystal quality thereof can be improved. When a target semiconductor device is prepared, it is possible to improve the characteristic thereof. FIG. 5 is a schematic sectional view showing a semiconductor light-emitting device 50 prepared with the inventive substrate 10 for epitaxial growth as an example of such a semiconductor device. The semiconductor light-emitting device 50 is prepared by forming an emission layer (semiconductor active layer) 53 consisting of a group III nitride semiconductor as well as a Schottky electrode 54 end an ohmic electrode 55, at least either of which is transparent for visible light, on the substrate 10 for epitaxial growth. The inventive substrate 10 for epitaxial growth is so employed as to improve the luminous efficiency of the semiconductor light-emitting device 50. In this figure, a Schottky type LED is described as an application of the present invention, but, of course, it is possible to apply the substrate to another application such as pn-type LED, LD, HEMT, HBT, and so forth.

The group III nitride film 2 satisfying the aforementioned requirements, which can be formed by a well-known film forming technique, is preferably formed by CVD while heating the 6H—SiC base 1 to at least 1100° C., or at least 1200° C. and particularly at least 1300° C. Thus, the group III nitride film 2 satisfying the aforementioned requirements can be simply formed. The aforementioned temperature is the preset temperature for the 6H—SiC base 1.

Figure 2:
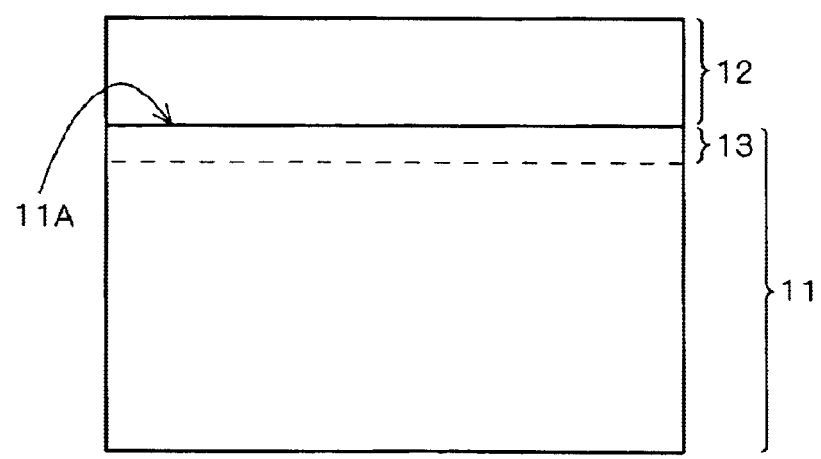
FIG. 2 is a schematic diagram showing another exemplary substrate for epitaxial growth according to the present invention.

FIG. 2 is a schematic diagram showing the structure of another exemplary substrate 20 for epitaxial growth according to the present invention. The substrate 20 for epitaxial growth shown in FIG. 2 is constituted of a 6H—SiC base 11 and a group III nitride film 12, containing at least Al, formed on the 6H—SiC base 11. In this substrate 20 for epitaxial growth, a nitrided layer 13 is formed on a main surface 11a of the 6H—SiC base 11, and the group III nitride film 12 is formed on this nitrided layer 13. The group III nitride film 12 is further improved in crystal quality due to the simple mode of formation of the nitrided layer 13. Further, the group III nitride film 12 is effectively inhibited from cracking.

The nitrided layer 13 is formed by arranging the 6H—SiC base 11 in an atmosphere containing active nitrogen such as ammonia and heating the same to at least 1100° C.

The molar fraction of nitrogen on the surface of the nitrided layer 13 is preferably at least 2 atomic % and more preferably at least 5 atomic %. In this case, the crystal quality of the group III nitride film 12 is improved and more effectively inhibited from cracking.

The nitrogen molar fraction on the surface of the nitrided layer 13 in the present invention has been derived from results of compositional analysis according to ESCA (electron spectroscopy for chemical analysis). Quantera SXM by PHI was employed for measurement for the compositional analysis. An Al-Kα1,2 rays (1486.6 eV) of 200 $\mu m$ in beam diameter were employed for an X-ray excitation source, and a photoelectron detection angle was set to 45°.

Requirements for the group III nitride film 12 are identical to those for the group III nitride film 2 shown in FIG. 1. Further, the group III nitride film 12 can be formed by CVD, similarly to the group III nitride film 2 shown in FIG. 1.

EXAMPLE 1

A 6H—SiC base having a thickness of 330 μm and a diameter of 2 inches was set in a prescribed reaction tube and heated to 1150° C. while trimethyl aluminum (TMA) and ammonia ($NH_3$), the molar ratio of those gases are set to NH3/TMA=0.1–500, were introduced into the reaction tube at a flow velocity of 5 m/sec., thereby forming an AlN film having a thickness of at least 0.5 μm on the 6H—SiC base. The nitrogen molar fraction on the surface of the 6H—SiC base was 2.1 atomic %.

The dislocation density of the AlN film formed with the thickness of 0.5 μm measured with a TEM (transmission electron microscope) was $2 \times 10^{10}/cm^2$. This AlN film exhibited a full width of 80 seconds at the half maximum of the X-ray rocking curve for (002) plane and a full width of 900 seconds at the half maximum of the X-ray rocking curve for (102) plane. Further, the surface roughness of the AlN film was 1.5 Å, and a clear atomic step was clearly observed with an AFM. Under these film forming conditions, the critical thickness causing cracking was 0.7 μm.

EXAMPLE 2

A 6H—SiC base was set in a reaction tube and heated to 1150° C. similarly to Example 1 while $NH_3$ was introduced along with hydrogen ($H_2$) carrier gas for nitriding the main surface of the 6H—SiC base and forming a nitrided layer with a thickness of 1 μm. Then, an AlN film having a thickness of at least 0.5 μm was formed under the same conditions as those in Example 1. Another 6H—SiC base subjected to only nitriding under the same conditions exhibited a nitrogen molar fraction of 10.3 atomic %.

The dislocation density of the AlN film formed with the thickness of 0.5 μm measured with a TEM was $2 \times 10^{10}/cm^2$. This AlN film exhibited a full width of 80 seconds at the half maximum of the X-ray rocking curve for (002) plane and a full width of 900 seconds at the half maximum of the X-ray rocking curve for (102) plane. Further, the surface roughness of the AlN film was 1.5 Å, and a clear atomic step was clearly observed with an AFM. Under these film forming conditions, the critical thickness causing cracking was 1.2 μm.

Comparative Example 1

A 4H—SiC base having a thickness of 330 μm and a diameter of 2 inches was employed for forming an AlN film with a thickness of 0.5 μm, similarly to Example 1. The dislocation density of the AlN film measured by TEM observation was $5 \times 10^{10}/cm^2$. This AlN film exhibited a full width of 400 seconds at the half maximum of the X-ray rocking curve for (002) plane and a full width of 1200 seconds at the half maximum of the X-ray rocking curve for (102) plane. Further, the surface roughness of the AlN film was 3.5 Å, while pits were observed on the surface with an AFM, with no clearly observed atomic step.

Comparative Example 2

A 4H—SiC base having a thickness of 330 μm and a diameter of 2 inches was employed for forming an AlN film with a thickness of 0.5 μm, similarly to Example 2. The dislocation density of the AlN film measured by TEM observation was $5 \times 10^{10}/cm^2$. This AlN film exhibited a full width of 300 seconds at the half maximum of the X-ray rocking curve for (002) plane and a full width of 1000 seconds at the half maximum of the X-ray rocking curve for (102) plane. Further, the surface roughness of the AlN film was 3.5 Å, while pits were observed on the surface with an AFM with no clearly observed atomic step.

As clearly understood from the aforementioned Examples and comparative examples, an AlN film formed by CVD while employing a 6H—SiC base and heating this base to a temperature of at least 1100° C. exhibits high crystal quality.

While the present invention has been described in detail on the basis of an embodiment of the present invention with reference to specific examples, the present invention is not restricted to the above contents but all changes and modifications are possible within a range not deviating from the category of the present invention.

For example, the group III nitride film, capable of containing Ga and In or the like in addition to Al as hereinabove described, may further contain additional elements such as Ge, Si, Mg, Zn, Be, P and B if necessary. The group III nitride film may further contain trace elements necessarily incorporated depending on film forming conditions or the like, or trace impurities contained in the raw materials and the material for the reaction tube in addition to intentionally added elements.

When a prescribed buffer layer and a multilaminated film of a strained superlattice and the like are formed between the 6H—SiC base and the group III nitride film, the crystal quality of the group III nitride film is further improved. The surface of the SiC base may be heat-treated in a high-temperature reducing atmosphere, to be modified. Further, the off-angle of the SiC base may be properly set.

What is claimed is:

1. A substrate for epitaxial growth, comprising:
   a 6H—SiC base; and
   a nitride film formed on said 6H—SiC base, wherein
   said nitride film contains at least an Al element, and exhibits dislocation density of not more than $1 \times 10^{11}/cm^2$, a full width at half maximum of an X-ray rocking curve of not more than 200 seconds for (002) plane and a full width at half maximum of an X-ray rocking curve of not more than 1500 seconds for (102) plane.

2. The substrate for epitaxial growth according to claim 1, wherein
   the thickness of said nitride film is at least 0.2 μm.

3. The substrate for epitaxial growth according to claim 1, wherein
   the surface roughness of said nitride film is not more the 3 Å.

4. The substrate for epitaxial growth according to claim 1, wherein
   the content of said Al element with respect to all group III elements in said nitride film is at least 50 atomic %.

5. The substrate for epitaxial growth according to claim 4, wherein
   said nitride film is an AlN film.

6. The substrate for epitaxial growth according to claim 1, wherein
   said nitride film is fanned by CVD at a temperature of at least 1100° C.

7. The substrate for epitaxial growth according to claim 1, wherein said 6H—SiC base has a nitrided layer, and said nitride film is formed on said nitrided layer.

8. The substrate for epitaxial growth according to claim 7, wherein the molar fraction of nitrogen on the surface of said 6H—SiC base is at least 3 atomic %.

9. The substrate for epitaxial growth according to claim 1, wherein the content of said Al element in said nitride film continuously or stepwisely decreases from the side of said 6H—SiC base toward the surface of said nitride film.

10. A semiconductor device, comprising:

a 6H—SiC base;

a nitride film formed on said 6H—SiC base; and a semiconductor active layer formed on said nitride film, wherein said nitride film contains at least an Al element, and exhibits dislocation density of not more than $1\times10^{11}/cm^2$, a full width at half maximum of an X-ray rocking curve for (002) plane of not mare than 200 seconds and a full width at half maximum of the X-ray rocking curve for (102) plane of not more than 1500 seconds.

* * * * *

UNITED STATES PATENT AND TRADEMARK OFFICE
CERTIFICATE OF CORRECTION

PATENT NO. : 6,869,702 B2
DATED : March 22, 2005
INVENTOR(S) : Tomohiko Shibata et al.

It is certified that error appears in the above-identified patent and that said Letters Patent is hereby corrected as shown below:

Column 6,
Line 61, please change "fanned" to -- formed --

Column 8,
Line 6, please change "mare" to -- more --

Signed and Sealed this

Twenty-fourth Day of May, 2005

JON W. DUDAS
*Director of the United States Patent and Trademark Office*